United States Patent
Hsueh et al.

(10) Patent No.: US 7,592,938 B2
(45) Date of Patent: Sep. 22, 2009

(54) ANALOG-TO-DIGITAL CONVERTER AND METHOD OF GAIN ERROR CALIBRATION THEREOF

(75) Inventors: Kang-Wei Hsueh, Hsinchu (TW); Yu-Hsuan Tu, Tainan (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 12/132,202

(22) Filed: Jun. 3, 2008

(65) Prior Publication Data
US 2009/0027246 A1   Jan. 29, 2009

Related U.S. Application Data

(60) Provisional application No. 60/951,254, filed on Jul. 23, 2007.

(51) Int. Cl.
  *H03M 1/06* (2006.01)
(52) U.S. Cl. ....................... 341/118; 341/161
(58) Field of Classification Search ............... 341/161, 341/155, 144, 120, 118
  See application file for complete search history.

(56) References Cited

U.S. PATENT DOCUMENTS 5,635,937 A * 6/1997 Lim et al. .................... 341/161
6,563,445 B1 * 5/2003 Sabouri ....................... 341/120
6,900,749 B2 * 5/2005 Tani et al. ................... 341/118
6,970,125 B2 * 11/2005 Cesura et al. ............... 341/161

* cited by examiner

*Primary Examiner*—Peguy JeanPierre
(74) *Attorney, Agent, or Firm*—Thomas, Kayden, Horstemeyer & Risley (57) ABSTRACT

The invention provides an analog-to-digital converter (ADC). The ADC comprises a plurality of stages connected in series, a gain error correction module, and a look-ahead module. Each of the stages derives a stage output value from a stage input signal and generates a stage output signal as the stage input signal of a subsequent stage, wherein one of the stages is selected as a target stage for estimating a gain value thereof. The gain error correction module delivers a correction number to the target stage to affect the stage output signal of the target stage and the stage output values of subsequent stages of the target stage, receives at least one auxiliary output value from a look-ahead module dedicated to the target stage, and derives an error estimate of the gain value of the target stage from the stage output values and the auxiliary output value. The look-ahead module generates the auxiliary output value according to the stage output value of the target stage, wherein the auxiliary output value is not affected by the correction number.

20 Claims, 7 Drawing Sheets

ANALOG-TO-DIGITAL CONVERTER AND METHOD OF GAIN ERROR CALIBRATION THEREOF

CROSS REFERENCE TO RELATED APPLICATIONS

This application claims the benefit of U.S. Provisional Application No. 60/951, 254, filed on Jul. 23, 2007, the entirety of which is incorporated by reference herein.

BACKGROUND OF THE INVENTION

1. Field of the Invention

The invention relates to analog-to-digital converters (ADC), and more particularly to gain error calibration of ADCs.

2. Description of the Related Art

An analog-to-digital converter converts an analog input signal to a digital output signal. Analog-to-digital converters are classified into several categories including flash ADCs, pipelined ADCs, and cyclic ADCs. Among the three ADC categories, a flash ADC has the shortest latency, because it has the simplest circuit structure. A flash ADC comprises multiple comparators directly comparing an analog input signal with multiple reference voltages to generate a digital output signal. When the required resolution of a digital output signal increases, a flash ADC must include a great number of comparators, increasing circuit complexity and chip area thereof. Thus, a flash ADC is only used when resolution of the digital output signal is low.

Figure 1:
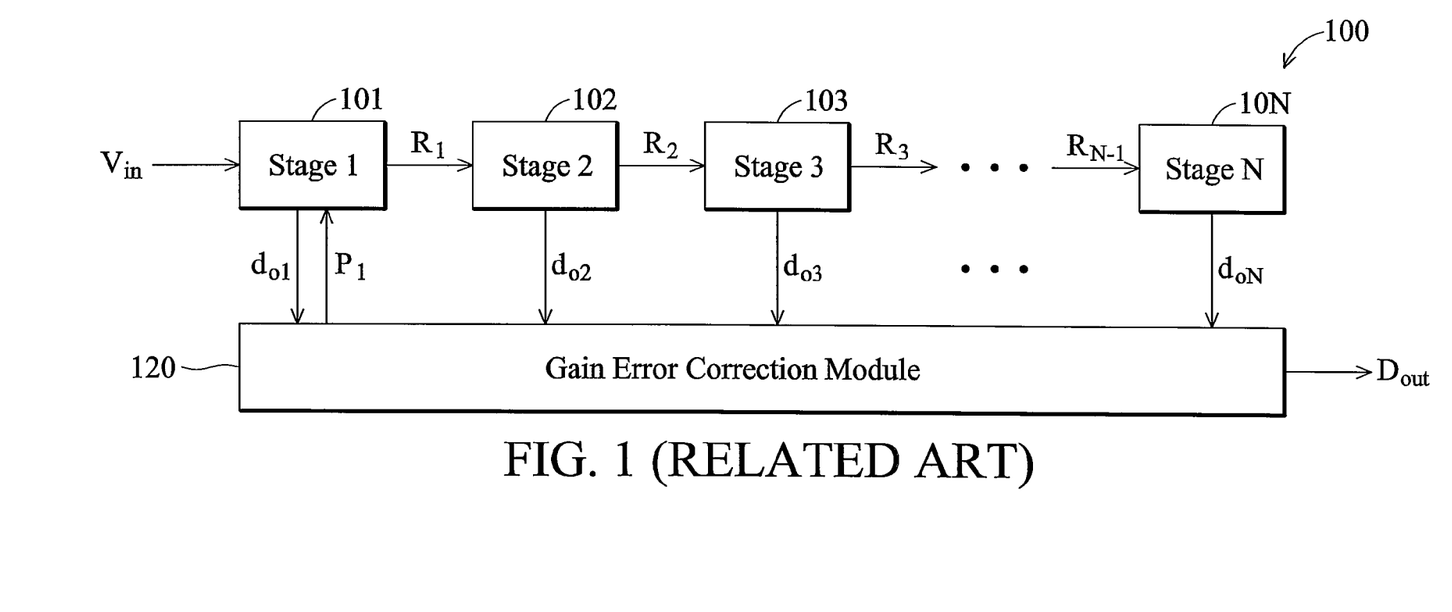
FIG. 1 is a block diagram of a conventional pipelined ADC.

Compared with a flash ADC, a pipelined ADC and a cyclic ADC require fewer comparators and occupy less chip area to generate a high resolution digital output signal. FIG. 1 is a block diagram of a conventional pipelined ADC 100. The pipelined ADC 100 comprises a plurality of stages 101-10N connected in series, with each stage generating a few bits of the digital output signal $D_{out}$. In the series, a preceding stage generates a stage output value indicating more significant bits of the digital output signal $D_{out}$, subtracts the stage output value from its stage input signal to obtain a residual signal, and amplifies the residual signal to obtain a stage output signal. A subsequent stage then receives the stage output signal of the preceding stage as a stage input signal thereof, and in the similar way generates its stage output value indicating less significant bits of the digital output signal $D_{out}$. For example, the second stage 102 generates a stage output value $d_{o2}$ and a stage output signal $R_2$ according to its stage input signal $R_1$, which is the stage output signal of the first stage 101. The gain error correction module 120 then collects the stage output values $d_{o1} \sim d_{oN}$ of stages 101~10N to generate the final digital output signal $D_{out}$. Because each stage only generates a few bits of the digital output signal $D_{out}$, the signal resolution of the stage output value is lower and each stage requires fewer comparators to operate.

Figure 2:
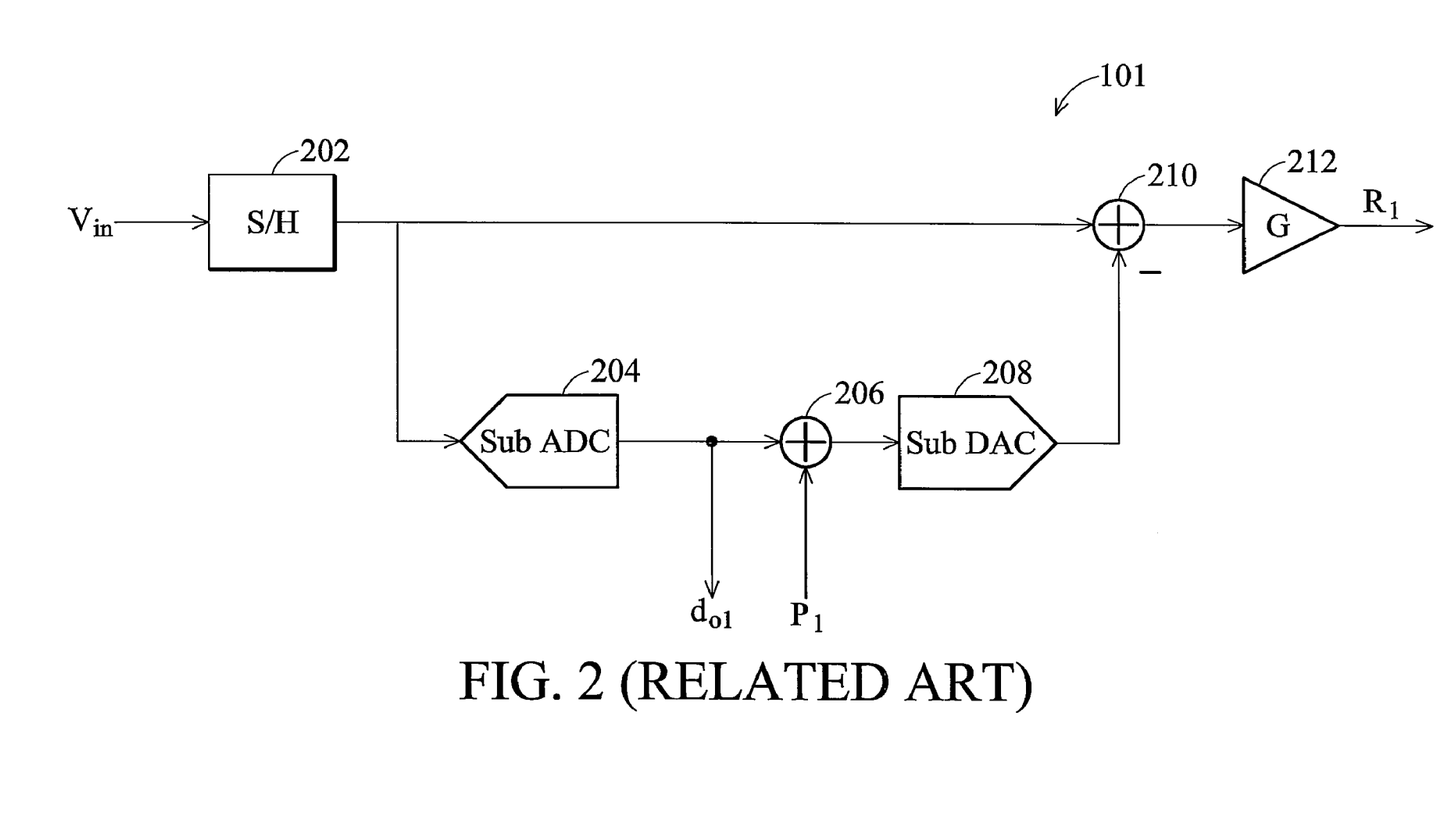
FIG. 2 is a block diagram of the first stage of the pipelined ADC of FIG. 1.

FIG. 2 is a block diagram of the first stage 101 of the pipelined ADC 100 of FIG. 1. The first stage 101 comprises a sample and hold module 202, a sub ADC 204, an adder 206, a sub DAC 208, a subtractor 210, and an amplifier 212. The sample and hold module 202 samples and holds a stage input signal $V_{in}$. Because the stage 101 is the first stage of the pipelined ADC 100, the stage input signal $V_{in}$ is an analog input signal of the ADC 100. The sub ADC 204 then digitizes the stage input signal $V_{in}$ to generate a stage output value $d_{o1}$ indicating the most important bits of the digital output signal $D_{out}$ of the pipelined ADC 100. In one embodiment, the sub ADC 204 is a flash ADC.

The adder 206 then adds a correction number $P_1$ to the stage output value $d_{o1}$ to obtain a sum value. The sub DAC 208 then converts the sum value from digital to analog to obtain a sum signal, and the subtractor 210 subtracts the sum signal from the stage input signal $V_{in}$ to obtain a residual signal. The amplifier 212 then amplifies the residual signal according to a gain value G to generate the stage output signal $R_1$. The stage output signal $R_1$ is then received by a subsequent stage 102 as the stage input signal thereof, and the subsequent stages 102 similarly generate the stage output value $d_{o2}$ thereof. The other stages of the pipelined ADC 100 have a structure similar to that of the first stage 101 except for omission of the sample and hold module 202 and the adder 206. In other stages without an adder 206, a subtractor 210 directly subtracts a stage output value converted by a sub DAC 208 from the stage input signal to generate a residual signal, which is then amplified by an amplifier 212 to generate a stage output signal.

Before a stage delivers the residual signal to a subsequent stage, the residual signal is amplified according to a gain value, thus, the subsequent stage can more precisely generate a stage output value. Although an ideal gain value of a stage is predetermined to be a constant, a practical gain value of a stage often changes due to chip fabrication errors or chip temperature. The difference between the practical gain value and the ideal gain value is referred to as a gain error. Because the gain error of a current stage affects the stage output values of subsequent stages, the gain error must be calibrated when the final digital output signal $D_{out}$ is generated according the stage output values $d_{o1} \sim d_{oN}$. Thus, the gain error correction module 120 of FIG. 1 must estimate the gain error of some of the stages to improve precision of the digital output signal $D_{out}$.

To estimate the gain error of the first stage 101 of FIG. 1, the gain error correction module 120 generates a correction number $P_1$ and delivers the correction number $P_1$ to the first stage 101. The first stage 101 then processes the residual signal thereof according to the correction number $P_1$ before it is amplified by the amplifier 212, as shown in FIG. 2. Thus, the stage output signal $R_1$ of the first stage 101 is affected by the gain value of the amplifier 212 and values of the correction number $P_1$. Because the stage input signals $R_1 \sim R_{N-1}$ of the subsequent stages 102~10N are derived from the stage output signal $R_1$ of the first stage 101, the stage output values $d_{o2} \sim d_{oN}$ of the subsequent stages 102~10N are affected by values of the correction number $P_1$. The gain error correction module 120 then correlates the stage output values $d_{o2} \sim d_{oN}$ of the subsequent stages 102~10N with the correction number $P_1$ to estimate an error of the gain value of the amplifier 212 of the first stage 101.

The gain error correction module 120 must collect a great number of samples of the stage output values $d_{o2} \sim d_{oN}$ to estimate the gain error of the first stage 101. The precision of the gain error estimate increases with the number of collected samples. If the number of collected samples is reduced, a low precision gain error estimate results, reducing the precision of the final digital output value $D_{out}$, thus degrading performance of the ADC 100. If the number of the collected samples is increased, the time required by collecting samples causes latency in signal conversion. Thus, a method for reducing time required for estimating gain errors of an ADC without reducing precision of a digital output signal is desirable.

BRIEF SUMMARY OF THE INVENTION

The invention provides an analog-to-digital converter (ADC). The ADC comprises a plurality of stages connected in series, a gain error correction module, and a look-ahead module. Each of the stages derives a stage output value from a stage input signal and generates a stage output signal as the stage input signal of a subsequent stage, wherein one of the stages is selected as a target stage for estimating a gain value thereof. The gain error correction module delivers a correction number to the target stage to affect the stage output signal of the target stage and the stage output values of subsequent stages of the target stage, receives at least one auxiliary output value from a look-ahead module dedicated to the target stage, and derives an error estimate of the gain value of the target stage from the stage output values and the auxiliary output value. The look-ahead module generates the auxiliary output value according to the stage output value of the target stage, wherein the auxiliary output value is not affected by the correction number.

The invention provides a method of gain error calibration in an analog-to-digital converter (ADC). The analog-to-digital converter comprises a plurality of stages connected in series. Each of the stages derives a stage output value from a stage input signal and generates a stage output signal as the stage input signal of a subsequent stage, wherein the stage output signal of a target stage selected from the stages is generated according to a correction number.

The method may comprise the following steps. At least one auxiliary output value is generated according to the stage output value of the target stage, wherein the auxiliary output value is not affected by the correction number. A weighted sum is generated according to the stage output values of subsequent stages of the target stage. An auxiliary portion corresponding to the auxiliary output value is subtracted from the weighted sum to obtain a remainder value. An error estimate of a gain value of the target stage is then derived according to the remainder value.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
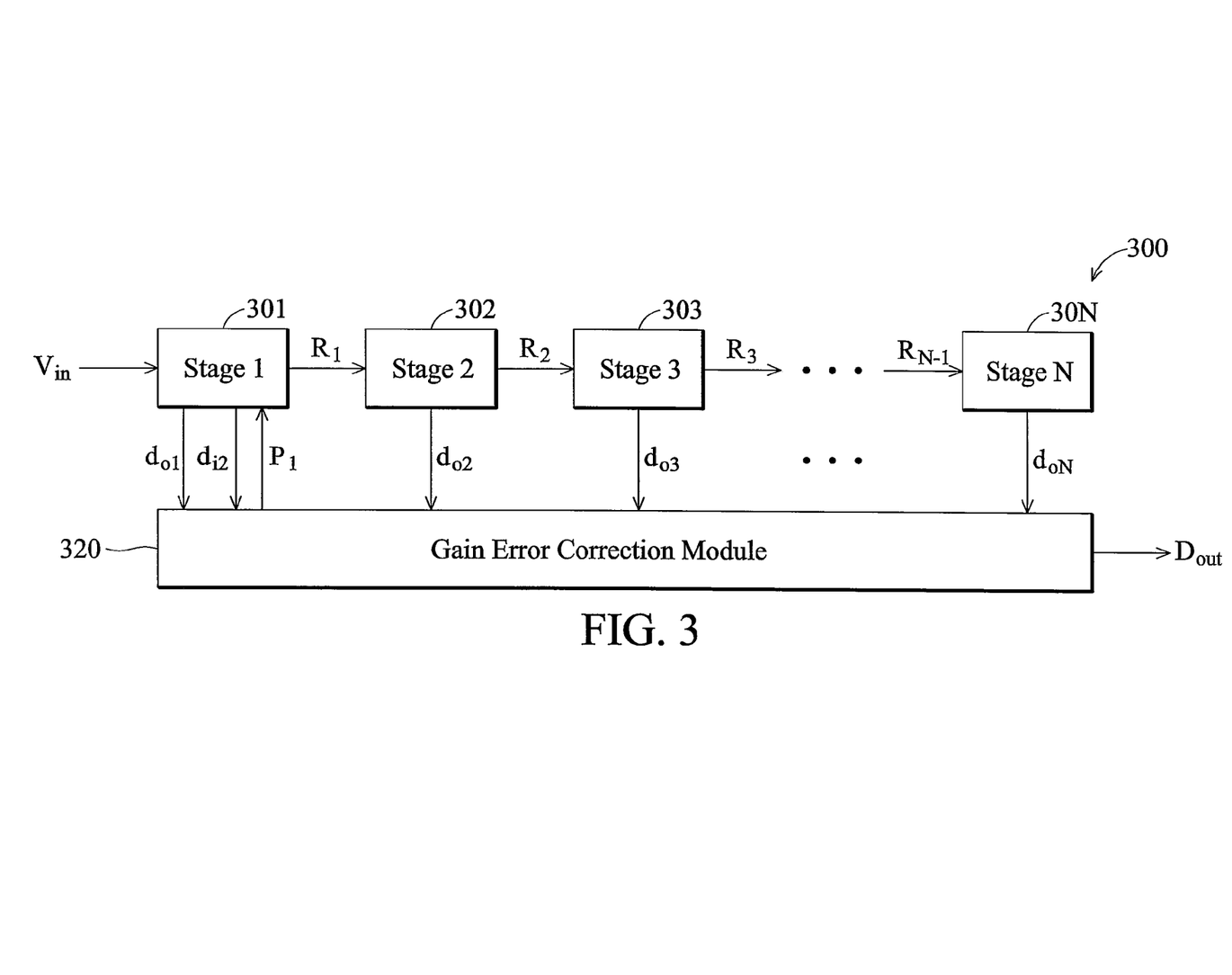
FIG. 3 is a block diagram of a pipelined ADC implementing gain error estimation of a first stage according to the invention.

FIG. 3 is a block diagram of a pipelined ADC 300 implementing gain error estimation of a first stage 301 according to the invention. The pipelined ADC 300 is roughly similar to the pipelined ADC 100 of FIG. 1 with the exception of the first stage 301 and the gain error correction module 320. To estimate a gain error of the first stage 301, the gain error correction module 320 generates a correction number $P_1$ fed to the first stage 301. After the first stage 301 generates a stage output value $d_{o1}$, the first stage 301 subtracts the stage output value $d_{o1}$ from its stage input signal $V_{in}$ to obtain a residual signal, processes the residual signal according to the correction number $P_1$, and then amplifies the residual signal according to a gain value to generate a stage output signal $R_1$ as the stage input signal of a subsequent stage 302.

The subsequent stages 302-30N generate stage output values $d_{o2} \sim d_{oN}$ and stage output signals $R_2 \sim R_{N-1}$ in the similar manner as the first stage 301, except that the stage output signals $R_2 \sim R_{N-1}$ are not processed with correction numbers dedicated to the stages thereof. Because the stage input signals $R_1 \sim R_{N-1}$ of the subsequent stages are determined according to the stage output signal $R_1$ of the first stage 301, the stage output values $d_{o2} \sim d_{oN}$ are affected by values of the correction number $P_1$. The gain error correction module 320 then estimates an error of the gain value of the first stage 301 according to the stage output values $d_{o2} \sim d_{oN}$ of the subsequent stages 302-30N and the correction number $P_1$. The gain error indicates a difference between a practical gain value and a predetermined gain value of the first stage 301.

Different from the first stage 101 of the pipelined ADC 100 of FIG. 1, the first stage 301 of the pipelined ADC 300 further comprises a look-ahead module. The look-ahead module of the first stage 301 generates at least one auxiliary output value, which indicates at least one bit of stage output values of subsequent stages 302-30N not affected by the correction number $P_1$, i.e. the value of the correction number is zero. Thus, in addition to the stage output value $d_{o1}$, the first stage 301 also generates an auxiliary output value $d_{i2}$ with a look-ahead module thereof.

The auxiliary output value $d_{i2}$ corresponding to the second stage 302 is then delivered to the gain error correction module 320, and the gain error correction module 320 estimates the gain error of the first stage 301 according to the auxiliary output value $d_{i2}$ in addition to the stage output values $d_{o2} \sim d_{oN}$. The gain error correction module 320 first generates a weighted sum according to the stage output values $d_{o2} \sim d_{oN}$ of the subsequent stages 302-30N. The conventional gain error correction module 120 of FIG. 1 directly estimates the gain error according to the weighted sum. The gain error correction module 320 of the invention, however, cancels a portion corresponding to auxiliary output value $d_{i2}$ from the weighted sum to obtain a remainder value, and then estimates the gain error of the first stage 301 according to the remainder value. Compared to the original weighted sum, the remainder value comprises more information about the gain error, and the gain error estimate converges more rapidly to a predetermined threshold. Thus, to estimate the gain error with a predetermined precision, the gain error correction module 320 requires fewer samples, reducing signal processing latency.

Figure 4:
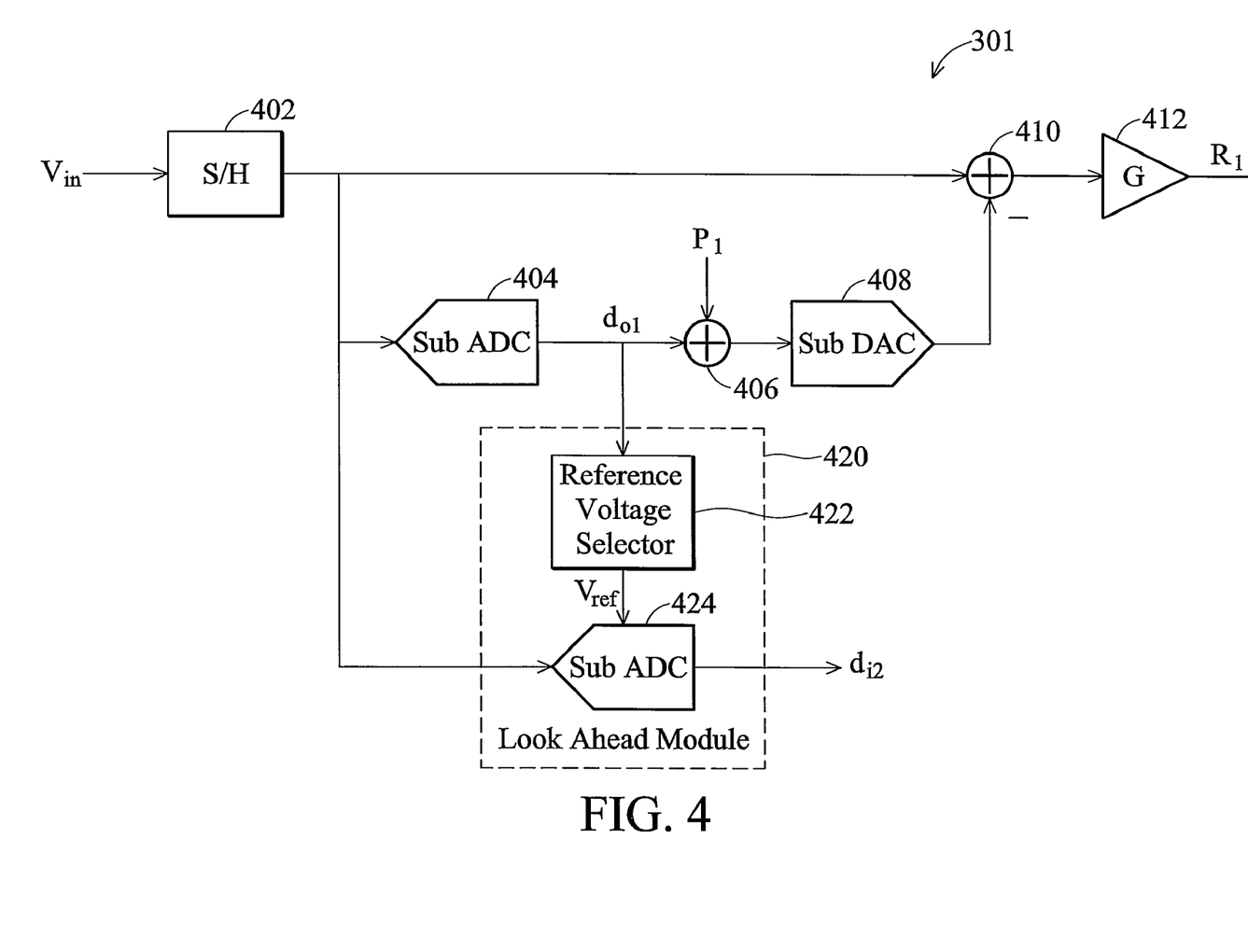
FIG. 4 is a block diagram of the first stage of the pipelined ADC of FIG. 3 according to the invention.

FIG. 4 is a block diagram of a first stage 301 of the pipelined ADC 300 of FIG. 3 according to the invention. The first stage 301 comprises a sample and hold module 402, a sub ADC 404, an adder 406, a sub DAC 408, a subtractor 410, an amplifier 412, and a look-ahead module 420. Except for the look-ahead module 420, functions of the other modules of the first stage 301 are similar to those of the corresponding modules of the first stage 101 of FIG. 2. After the sub ADC 404 generates a stage output value $d_{o1}$, the look-ahead module 420 generates an auxiliary output value $d_{i2}$ according to the stage output value $d_{o1}$ and the stage input signal $V_{in}$.

The look-ahead module 420 comprises a reference voltage selector 422 and a sub ADC 424. The reference voltage selector determines multiple reference voltages $V_{ref}$ according to the stage output value $d_{o1}$ of the first stage 301. The sub ADC 424 then compares the stage input signal $V_{in}$ with the reference voltages $V_{ref}$ to obtain the auxiliary output value $d_{i2}$ corresponding to the subsequent stage 302. In one embodiment, the reference voltage selector 422 is a lookup table with an input of the stage output value $d_{o1}$ and an output of multiple reference voltage values $V_{ref}$.

More bits the auxiliary output value generated according to the stage output value $d_{o1}$ and the stage input signal $V_{in}$ looks ahead, more rapidly the gain error estimate converges, and fewer samples are required to obtain a gain error estimate with predetermined precision.

While the stage 301 processes the stage output value $d_{o1}$ according to the correction number $P_1$, the correction number $P_1$ must be converted to an analog signal amplified to a signal level corresponding to the stage output value $d_{o1}$. Generally, a capacitor with capacitance C is used to adjust the signal level of the correction number $P_1$. If the level range of the stage input signal is between $-Vr$ and $Vr$, and the level of the correction number $P_1$ is intended to be $-Vr/4$ or $Vr/4$, thus a capacitor with the capacitance $C/4$ can be used to adjust the signal level of the correction number $P_1$ to $-Vr/4$ or $Vr/4$.

Figure 5:
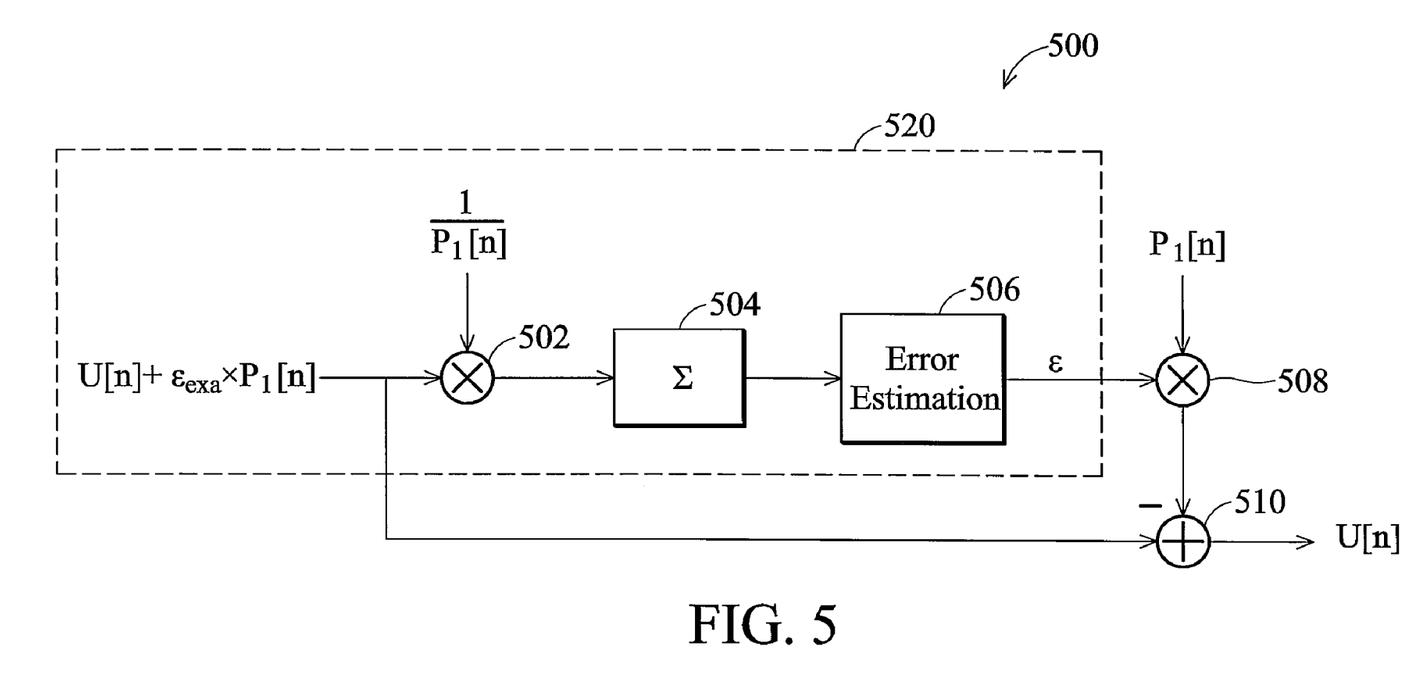
FIG. 5 shows an estimation process of a gain error in a conventional gain error correction module of FIG. 1.
Figure 6:
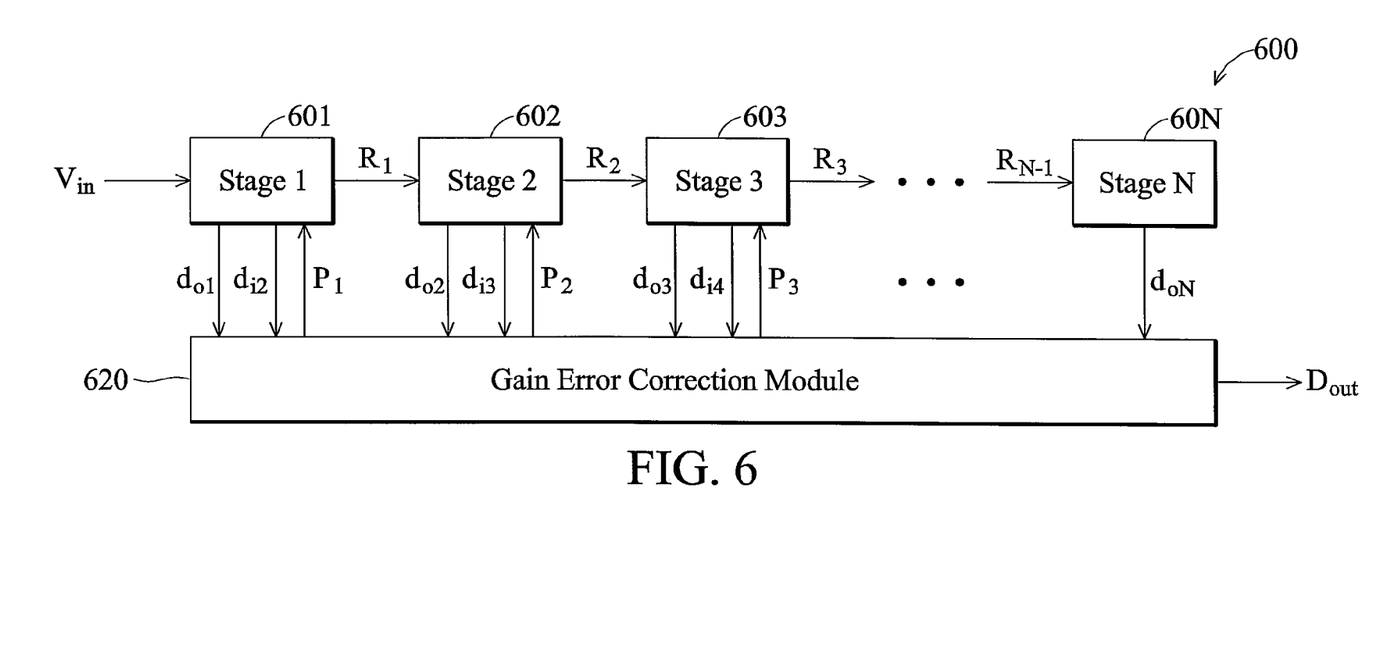
FIG. 6 shows a pipelined ADC estimating gain errors of all stages therein according to the invention.

FIG. 5 shows a component circuit 500 of a gain error in a conventional gain error correction module 120 of FIG. 1. The component circuit 500 comprises an estimation circuit 520, a multiplier 508, and a subtractor 510. The estimation circuit 520 comprises a multiplier 502, a summation module 504, and an error estimation module 506. The estimation circuit 520 derives a gain error estimate $\epsilon$ from a weighted sum generated by the gain error correction module 120, and the subtractor 510 then eliminates a portion $P_1[n] \times \epsilon$ from the weighted sum. The gain error correction module 120 first generates a weighted sum according to the stage output values $d_{o2}$~$d_{oN}$ of subsequent stages 102~10N of the first stage 101. In one embodiment, the weighted sum is generated according to the following algorithm:

$$A = d_{o2} \times G^{N-2} + d_{o3} \times G^{N-3} + \Lambda + d_{o(N-1)} \times G + d_{oN}; \quad (1)$$

wherein A is the weighted sum, G is a predetermined gain value of the stages, (N−1) is a number of the subsequent stages 102~10N of the first stage, and $d_{o2}, d_{o3}, \ldots, d_{o(N-1)}$, and $d_{oN}$ are respectively the stage output values of the subsequent stages 102~10N. The weighted sum A is expressed as $(U[n] + \epsilon_{exa} \times P_1[n])$ of FIG. 6, wherein $\epsilon_{exa}$ is the exact gain error, $P_1[n]$ is the correction number, $U[n]$ is a portion not affected by the correction number, and n is a sample index. The estimation circuit 520 of the gain error correction module 120 then derives the gain error estimate $\epsilon$ from the weighted sum A according to the following algorithm:

$$\varepsilon = \frac{1}{K} \times \sum_{n=1}^{K} \frac{A[n]}{P_1[n]} \quad (2)$$

$$= \frac{1}{K} \times \sum_{n=1}^{K} \frac{U[n] + \varepsilon_{exa} \times P_1[n]}{P_1[n]}$$

$$= \frac{1}{K} \times \sum_{n=1}^{K} \left( \frac{U[n]}{P_1[n]} + \varepsilon_{exa} \right)$$

$$= \frac{1}{K} \times \sum_{n=1}^{K} \left( \frac{U[n]}{P_1[n]} \right) + \varepsilon_{exa}$$

wherein K is a number of accumulated samples. Because $P_1[n]$ is randomly generated and $U[n]$ is in no way related with $P_1[n]$, the term $$\sum_{n=1}^{K} \frac{U[n]}{P_1[n]}$$

converges to zero when the sample number K approaches a large number, and the error estimate $\epsilon$ is obtained.

To obtain an error estimate $\epsilon$ with precision, however, a great number of samples are required for the algorithm (2) to converge, causing latency in signal processing. If the number of samples is reduced, the algorithm (2) does not converge and the obtained error estimate $\epsilon$ is not precise. To solve the problem, the gain error correction module 320 provided by the invention cancels a portion corresponding to the auxiliary output values $d_{i2}$ from the weighted sum A to obtain a remainder value, and then derives an error estimate $\epsilon$ of the gain value of the first stage 301 according to the remainder value. Thus, the error estimate $\epsilon$ converges more rapidly.

The gain error correction module 320 first generates a weighted sum A according to the algorithm (1), and then generates an auxiliary portion B according to the auxiliary output value $d_{i2}$. The auxiliary portion B is calculated according to the following algorithm:

$$B = d_{i2} \times G^{N-2}; \quad (3)$$

wherein B is the auxiliary portion, G is a predetermined gain value of the stages, (N−2) is a number of the subsequent stages 303~30N of the second stage 302, and $d_{i2}$ is the auxiliary output value generated by a look-ahead module or zero if not generated. The gain error correction module 320 then subtracts the auxiliary portion B from the weighted sum A to obtain the remainder value. The gain error correction module 320 then derives the error estimate $\epsilon$ according to the following algorithm:

$$\varepsilon = \frac{1}{K} \times \sum_{n=1}^{K} \frac{A[n] - B[n]}{P_1[n]} \quad (4)$$

$$= \frac{1}{K} \times \sum_{n=1}^{K} \frac{(U[n] - B[n]) + \varepsilon_{exa} \times P_1[n]}{P_1[n]}$$

$$= \frac{1}{K} \times \sum_{n=1}^{K} \left( \frac{U[n] - B[n]}{P_1[n]} + \varepsilon_{exa} \right)$$

$$= \frac{1}{K} \times \sum_{n=1}^{K} \left( \frac{U[n] - B[n]}{P_1[n]} + \varepsilon_{exa} \right)$$

$A[n]$ is derived from the stage output values $d_{o2}$~$d_{oN}$ affected by the correction number $P_1[n]$, and $B[n]$ is correspondingly derived from the auxiliary output value $d_{i2}$ not affected by the correction number $P_1[n]$. Because $A[n]$ and $B[n]$ are correspondingly generated, the a major portion of $A[n]$ not affected by the correction number $P_1[n]$ is cancelled by $B[n]$, and the term $(U[n]-B[n])$ in the algorithm (4) is reduced to a small value compared with the term $U[n]$ in the algorithm (2). Thus, the term $$\sum_{n=1}^{K} \frac{U[n]-B[n]}{P_1[n]}$$

of the algorithm (4) converges more rapidly than the term $$\sum_{n=1}^{K} \frac{U[n]}{P_1[n]}$$

of the algorithm (2), and the gain error correction module 320 requires fewer samples to obtain an error estimate ϵ with the same precision.

The performance of the pipelined ADC 100 and 300 of FIGS. 1 and 3 are compared in the following. The gain error correction modules 120 and 320 may estimate the gain errors of the first stages 101 and 301 with the same number of samples. Because the gain error estimated by the gain error correction modules 320 converges more rapidly, the gain error correction modules 320 obtains the gain error with greater precision, and the digital output signal $D_{out}$ generated according to the gain error is more accurate. Thus, the digital output signal $D_{out}$ generated by the pipelined ADC 300 with a look-ahead module has a higher ENOB than that of the digital output signal $D_{out}$ generated by the conventional ADC 100.

Although only the gain error of the first stage is estimated of FIG. 3, a gain error correction module can estimate gain errors of other stages in a similar way. FIG. 6 shows a pipelined ADC 600 estimating gain errors of more than one stage therein according to the invention. A gain error correction module 620 delivers different correction numbers $P_1 \sim P_{N-1}$ to stages 601~60(N−1). Because they all have a look-ahead module, the stages 601~60(N−1) respectively generate stage output values $d_{o1}$—$d_{o(N-1)}$, and also generates auxiliary output values $d_{i2} \sim d_{iN}$ corresponding to a subsequent stage thereof. The gain error correction module 620 then estimates the gain errors of the stages 601~60(N−1) according to both the stage output values $d_{o2} \sim d_{oN}$ and the auxiliary output values $d_{i2} \sim d_{iN}$.

Figure 7:
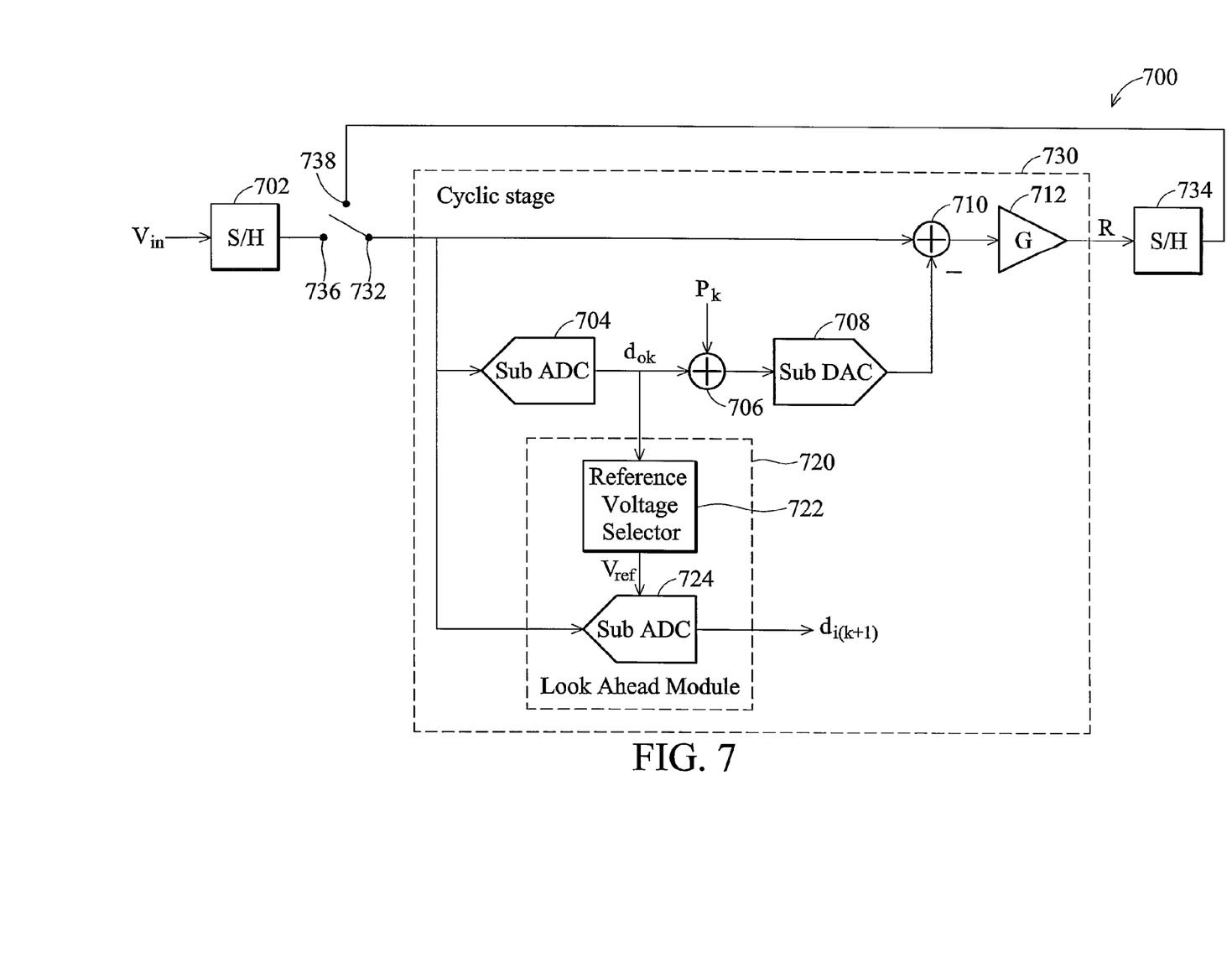
FIG. 7 is a block diagram of a cyclic ADC according to the invention

Although the gain error estimation method provided by the invention is illustrated with examples of pipelined ADCs, the method can be applied to cyclic ADCs. Referring to FIG. 7, a block diagram of a cyclic ADC 700 according to the invention is shown. The cyclic ADC 700 comprises two sample and hold circuits 702 and 734, a switch 732, and a physical stage circuit 730 with a structure similar to the stage 301 of the pipelined ADC 300. Although the cyclic ADC 700 has a plurality of logical stages, the stages of the cyclic ADC 700 share only one physical circuit 730. Thus, the physical stage circuit 730 processes input signals of logical cyclic ADC stages by time division multiplexing. For example, the switch 732 may periodically switch between nodes 736 and 738 to transmits a feed back of a stage output signal R and an input signal $V_{in}$ respectively stored in the sample and hold circuits 702 and 734 to the physical stage circuit 730 for processing. The physical stage circuit 730 comprises a look ahead module 720 deriving an auxiliary output value $d_{i(k+1)}$ corresponding to a subsequent logical stage. A gain error correction module of the cyclic ADC 700 can then estimate the gain errors of the logical stages thereof according to both the stage output values $d_{ok}$ and the auxiliary output value $d_{i(k+1)}$ according to equations (1), (3), and (4).

Although the embodiments of FIGS. 3 and 4 calibrate the gain error of the first stage 301 of the pipelined ADC 300, the look ahead module 420 can be applied to any stage of the pipelined ADC 300 to generate the auxiliary output value. The gain error correction module 320 of FIG. 3 can therefore perform gain error estimation of any stage according to the auxiliary output value with a high convergence speed, thus improving performance of the pipelined ADC 300.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An analog-to-digital converter (ADC), comprising:
   a plurality of stages connected in series, each deriving a stage output value from a stage input signal and generating a stage output signal as the stage input signal of a subsequent stage, wherein one of the stages is selected as a target stage for estimating a gain value thereof;
   a gain error correction module coupled to the stages, delivering a correction number to the target stage to affect the stage output signal of the target stage and the stage output values of subsequent stages of the target stage, receiving at least one auxiliary output value from a look-ahead module dedicated to the target stage, and deriving an error estimate of the gain value of the target stage from the stage output values and the auxiliary output value; and
   a look-ahead module, coupled to the target stage and the gain error correction module, generating the auxiliary output value according to the stage output value of the target stage, wherein the auxiliary output value is not affected by the correction number.

2. The analog-to-digital converter as claimed in claim 1, wherein the gain error correction module generates a weighted sum according to the stage output values of the subsequent stages of the target stage, subtracts an auxiliary portion corresponding to the auxiliary output value from the weighted sum to obtain a remainder value, and derives the error estimate of the gain value of the target stage according to the remainder value.

3. The analog-to-digital converter as claimed in claim 2, wherein to derive the error estimate of the gain value of the target stage according to the remainder value, the gain error correction module further divides the remainder value by the correction number to obtain a quotient value, and accumulates the quotient value to obtain the error estimate of the gain value of the target stage.

4. The analog-to-digital converter as claimed in claim 3, wherein the gain error correction module generates the weighted sum according to the following algorithm:

$$A = d_{o2} \times G^{N-2} + d_{o3} \times G^{N-3} + \Lambda + d_{o(N-1)} \times G + d_{oN};$$

wherein A is the weighted sum, G is a predetermined gain value of the stages, (N−1) is a number of the subsequent stages of the target stage, and $d_{o2}, d_{o3}, \ldots, d_{o(N-1)}$, and $d_{oN}$ are respectively the stage output values of the subsequent stages;

and the gain error correction module generates the auxiliary portion according to the following algorithm:

$$B = d_{i2} \times G^{N-2};$$

wherein B is the auxiliary portion, G is a predetermined gain value of the stages, (N−1) is a number of the subsequent stages of the target stage, and $d_{i2}$ is the auxiliary output value generated by the look-ahead module or zero if not generated.

5. The analog-to-digital converter as claimed in claim 4, wherein the gain error correction value generates the error estimate according to the following algorithm:

$$\varepsilon = \frac{1}{K} \times \sum_{n=1}^{K} \frac{A[n] - B[n]}{P[n]};$$

wherein $\varepsilon$ is the error estimate, A is the weighted sum, B is the auxiliary portion, P is the correction number, n is a sample index, and K is a number of accumulated samples.

6. The analog-to-digital converter as claimed in claim 1, wherein each of the stages subtracts the stage output value from the stage input signal to generate a residual signal, and amplifies the residual signal to obtain the stage output signal, and the residual signal of the target stage is processed according to the correction number before being amplified.

7. The analog-to-digital converter as claimed in claim 6, wherein the target stage comprises:
   a sub ADC, digitizing the stage input signal of the target stage to generate the stage output value;
   an adder, coupled to the sub ADC, adding the correction number to the stage output value to obtain a sum value;
   a sub DAC, coupled to the adder, converting the sum value from digital to analog to generate a sum signal;
   a subtractor, subtracting the sum signal from the stage input signal to obtain the residual signal; and
   an amplifier, amplifying the residual signal according to the gain value to generate the stage output signal of the target stage.

8. The analog-to-digital converter as claimed in claim 1, wherein the analog-to-digital converter converts an analog input signal to a digital output signal, the analog input signal is the stage input signal of a first stage of the stages, and the stage output values collectively form the digital output signal.

9. The analog-to-digital converter as claimed in claim 1, wherein the look-ahead module comprises:
   a first reference voltage selector, determining a plurality of first reference voltages according to the stage output value of the target stage; and
   a first sub ADC, coupled to the first reference voltage selector, comparing the stage input signal of the target stage with the first reference voltages to obtain the auxiliary output value.

10. The analog-to-digital converter as claimed in claim 1, wherein the analog-to-digital converter is a pipelined ADC or a cyclic ADC.

11. The analog-to-digital converter as claimed in claim 1, wherein the target stage comprises a capacitor adjusting a voltage range of the correction number to a quarter of a voltage range of the stage input signal of the target stage.

12. A method of gain error calibration in an analog-to-digital converter (ADC), wherein the analog-to-digital converter comprises a plurality of stages connected in series, each deriving a stage output value from a stage input signal and generating a stage output signal as the stage input signal of a subsequent stage, wherein the stage output signal of a target stage selected from the stages is generated according to a correction number, the method comprising:

generating at least one auxiliary output value according to the stage output value of the target stage, wherein the auxiliary output value is not affected by the correction number;

generating a weighted sum according to the stage output values of subsequent stages of the target stage;

subtracting an auxiliary portion corresponding to the auxiliary output value from the weighted sum to obtain a remainder value; and deriving an error estimate of a gain value of the target stage according to the remainder value.

13. The method of gain error calibration in an ADC as claimed in claim 12, wherein the ADC converts an analog input signal to a digital output signal, the analog input signal is the stage input signal of a first stage of the stages, and the stage output values collectively form the digital output signal.

14. The method of gain error calibration in an ADC as claimed in claim 12, wherein the target stage comprises:
   a sub ADC, digitizing the stage input signal of the target stage to generate the stage output value;
   an adder, coupled to the sub ADC, adding the correction number to the stage output value to obtain a sum value;
   a sub DAC, coupled to the adder, converting the sum value from digital to analog to generate a sum signal;
   a subtractor, subtracting the sum signal from the stage input signal to obtain a residual signal; and
   an amplifier, amplifying the residual signal according to the gain value to generate the stage output signal of the target stage.

15. The method of gain error calibration in an ADC as claimed in claim 12, wherein generation of the auxiliary output value comprises:
   determining a plurality of first reference voltages according to the stage output value of the target stage; and
   comparing the stage input signal of the target stage with the first reference voltages to obtain the auxiliary output value.

16. The method of gain error calibration in an ADC as claimed in claim 12, wherein derivation of the error estimate comprises:
   dividing the remainder value by the correction number to obtain a quotient value; and
   accumulating the quotient value to obtain the error estimate of the gain value of the target stage.

17. The method of gain error calibration in an ADC as claimed in claim 16, wherein the weighted sum is generated according to the following algorithm:

$$A = d_{o2} \times G^{N-2} + d_{o3} \times G^{N-3} + \Lambda + d_{o(N-1)} \times G + d_{oN};$$

wherein A is the weighted sum, G is a predetermined gain value of the stages, (N−1) is a number of the subsequent stages of the target stage, and $d_{o2}, d_{o3}, \ldots, d_{o(N-1)}$, and $d_{oN}$ are respectively the stage output values of the subsequent stages;

and the auxiliary portion is generated according to the following algorithm:

$$B = d_{i2} \times G^{N-2};$$

wherein B is the auxiliary portion, G is a predetermined gain value of the stages, (N−1) is a number of the subsequent stages of the target stage, and $d_{i2}$ is the auxiliary output value.

18. The method of gain error calibration in an ADC as claimed in claim 17, wherein the error estimate is generated according to the following algorithm:

$$\varepsilon = \frac{1}{K} \times \sum_{n=1}^{K} \frac{A[n] - B[n]}{P[n]};$$

wherein $\varepsilon$ is the error estimate, A is the weighted sum, B is the auxiliary portion, P is the correction number, n is a sample index, and K is a number of accumulated samples.

19. The method of gain error calibration in an ADC as claimed in claim 12, wherein the analog-to-digital converter is a pipelined ADC or a cyclic ADC.

20. The method of gain error calibration in an ADC as claimed in claim 12, wherein the method further comprises adjusting a voltage range of the correction number to a quarter of a voltage range of the stage input signal of the target stage with a capacitor.

* * * * *